United States Patent [19]

Lam et al.

[11] Patent Number: 4,487,639
[45] Date of Patent: Dec. 11, 1984

[54] LOCALIZED EPITAXY FOR VLSI DEVICES

[75] Inventors: Hon W. Lam; Ham-Tzong Yuan, both of Dallas, Tex.

[73] Assignee: Texas Instruments Incorporated, Dallas, Tex.

[21] Appl. No.: 456,209

[22] Filed: Jan. 7, 1983

Related U.S. Application Data

[63] Continuation of Ser. No. 191,478, Sep. 26, 1980, abandoned.

[51] Int. Cl.³ .................. H01L 21/263; H01L 21/428
[52] U.S. Cl. ...................................... 148/175; 29/571;
29/576 E; 29/576 T; 29/577 C; 29/578;
29/580; 148/1.5; 148/174; 148/187; 156/603;
156/612; 156/DIG. 73; 156/DIG. 80;
427/53.1; 427/86; 427/35; 357/42; 357/49;
357/50; 357/59
[58] Field of Search ............... 29/577 C, 578, 580,
29/571, 576 E, 576 T; 148/1.5, 174, 175, 187;
156/612, DIG. 80, DIG. 73, 603; 427/86, 53.1,
35; 357/42, 50, 59, 49

[56] References Cited

U.S. PATENT DOCUMENTS

| | | | |
|---|---|---|---|
| 3,796,613 | 3/1974 | Magdo et al. | 148/175 |
| 3,861,968 | 1/1975 | Magdo et al. | 148/175 |
| 3,944,447 | 3/1976 | Magdo et al. | 148/175 |
| 4,214,918 | 7/1980 | Gat et al. | 148/1.5 |
| 4,231,819 | 11/1980 | Raffel et al. | 29/580 X |
| 4,269,631 | 5/1981 | Anantha et al. | 148/1.5 |
| 4,270,960 | 6/1981 | Bollen et al. | 148/174 X |
| 4,274,891 | 6/1981 | Silvestri et al. | 148/175 |

OTHER PUBLICATIONS

Davies et al., "Poly I²L-A High-Speed Linear-Compatible Structure", IEEE J. Solid-State Circ., vol. SC-R, No. 4, Aug. 1977, pp. 367-375.
"Schnelle I²L-Schaltung", Neves Aus Der Technik, vol. 1978, No. 4, Aug. 1978, p. 1.
Magdo et al., "Fabricating Complimentary MOS Transistors", IBM Tech. Discl. Bull., vol. 15, No. 6, Nov. 1972, pp. 1767-1768.
Magdo et al., "Fabricating Complementary Transistors", IBM Tech. Discl. Bull., vol. 15, No. 7, Dec. 1972, pp. 2294-2295.

Primary Examiner—William G. Saba
Attorney, Agent, or Firm—William E. Hiller; James T. Comfort; Melvin Sharp

[57] ABSTRACT

A method of forming a semiconductor device having a single crystal silicon substrate, the surface of which includes exposed silicon areas bounded by and coplanar with insulating oxide regions. A polysilicon layer is deposited thereon and annealed to form a single crystal epitaxial region overlying the exposed substrate areas while the regions overlying the oxide areas in the substrate surface may be of polycrystalline form. This structure is applied to NMOS, CMOS, MESFET, and I²L devices to achieve high packing density, high speed, improved isolation between devices and reduced susceptibility to latch-up.

6 Claims, 11 Drawing Figures

LOCALIZED EPITAXY FOR VLSI DEVICES

This is a continuation of application Ser. No. 191,478, filed Sept. 26, 1980 now abandoned.

BACKGROUND OF THE INVENTION

This invention relates generally to microelectronic semiconductor devices, and more particularly to devices suited for very large scale integrated circuit (VLSI) applications.

The development of integrated semiconductor circuit design has been characterized by a trend toward increasing circuit densities. Various technologies have been devised to stimulate this trend. For example, transistor-transistor logic (TTL) was standard in digital equipment for a long time but has given way in many areas to N-channel MOS logic circuits because of their superiority in speed power product, packing density and ease of device fabrication. For these reasons, devices fabricated using these technologies are finding application primarily in memory and microprocessor circuits.

In one method that has been used to improve device isolation and achieve higher packing density and higher speed, a thin layer of oxide is grown on a substrate of single crystal silicon. A thin layer of polysilicon is then deposited on the oxide and standard photolithographic techniques are used to define an opening in a photoresist deposited thereon. The polysilicon and the oxide in the opening are subsequently removed by etching, exposing the surface of the single crystal silicon substrate. After removing the photoresist, an epitaxial layer is grown using a standard vapor phase epitaxy technique. The layer of polysilicon is required for proper seeding of the silicon layer on the oxide during epitaxial growth. In the resulting structure, the region in the epitaxial layer directly over the substrate will be a single crystal while the epitaxial region over the oxide will be polycrystalline.

One problem with this technique is that the oxide layer cannot be very thick, otherwise vapor phase epitaxial growth thereon is not possible and will cause problems in subsequent circuit fabrication. Another problem is that at conditions that are conductive to vapor phase epitaxial growth on the single crystal silicon region, the grain size of the polysilicon at the oxide substrate is usually very large, resulting in a very rough and granular surface and a very ragged interface between the polysilicon region and the single crystal region. Further, when the size of the opening is in the submicron range, a ragged interface will cause a higher leakage current and make it harder to define the subsequent geometry of the device.

One object of this invention is to provide a method of making an improved device particularly useful in the design of high density digital logic circuits. Another object is to provide a method of making a device having high speed, scalability and improved immunity to ionizing radiation.

SUMMARY OF THE INVENTION

In accordance with the present invention, a monocrystalline silicon substrate is etched to form a central portion bounded by recessed areas. An oxide is grown in the recessed areas so that the surface of the substrate has an exposed silicon area coplanar with and bounded by oxide areas. A layer of amorphous or polycrystalline silicon is then deposited on the substrate and subjected to thermal annealing or transient radiation annealing, for example, laser or E-beam, causing epitaxial growth in the region directly over the central exposed portion of the substrate in contact with the polysilicon. FET devices fabricated according to the present process exhibit high speed because the source-to-substrate capacitance is reduced by using a thick oxide layer, and the structure is scalable by reducing the thickness of the epitaxial layer without reducing the thickness of the oxide.

In one embodiment of the invention, an NMOS device is fabricated from the basic structure by forming a moderately doped P-type region completely contained within the epitaxial region formed in the polysilicon layer. The P-type region extends to the surface of a P+ substrate. N+ regions are then formed adjacent to each side of the P-type region, slightly overlapping the exposed silicon areas on the surface of the substrate. The remaining polysilicon material in the epitaxial layer is converted to an oxide and the device is completed by the formation of a gate oxide and gate over the P-type region.

Possible electrical shorts between the polysilicon layer and the substrate in CMOS devices are prevented by including therebetween an epitaxial layer having oxide regions under the source and drain in the polysilicon layer.

The present invention is also applicable to I$^2$L and MESFET device technologies to yield higher packing densities, high speed and improved isolation between devices.

BRIEF DESCRIPTION OF THE DRAWINGS

The novel features believed characteristic of the invention are set forth in the appended claims. The inventon itself, however, as well as further objects and advantages thereof, will be best understood by reference to the following detailed description when read in conjunction with the accompanying drawings in which like numerals represent like parts throughout several views, and wherein:

DESCRIPTION OF THE PREFERRED EMBODIMENT

Figure 1A:
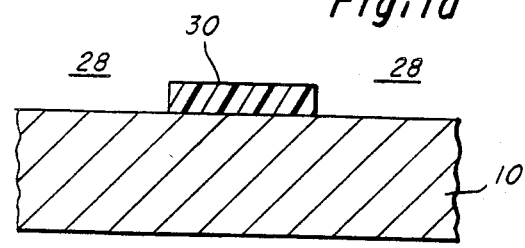
FIGS. 1a–1c are greatly enlarged cross-sectional views of a partially completed semiconductor chip fabricated according to the process of the present invention.
Figure 1B:
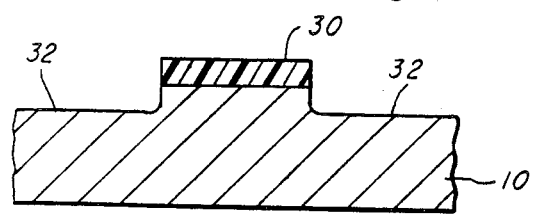
Figure 1C:
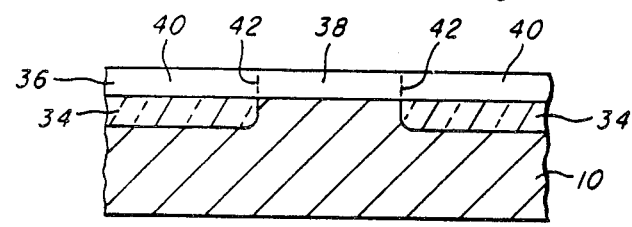

Referring now to the drawings, there is shown in FIGS. 1a–1c a portion of a semiconductor device in various stages of manufacture according to the process of the present invention. A layer of silicon nitride is deposited on a substrate 10 formed of monocrystalline silicon. Any suitable photolithographic technique is then used to define openings 28 in the nitride layer, from which the nitride is removed by an etchant to form an island 30 of nitride as shown in FIG. 1a. An amount of silicon is then removed from the exposed substrate 10 to form recessed areas 32 on either side of the nitride island 30.

The chip is then subjected to a thermal oxidation cycle for a length of time sufficient to form an oxide layer 34 coplanar with the surface of the substrate 10. The thickness of the oxide layer 34 may be varied to achieve a desired capacitance and circuit performance in the completed device. The nitride layer 30 is removed and a layer of amorphous or polycrystalline silicon 36 is deposited on the chip to form the structure of FIG. 1c.

To induce epitaxial regrowth in layer 36, a transient radiation or a thermal annealing technique is used. Thermal annealing is performed at a temperature of perhaps 600° C., as compared to a temperature of about 1050° C. required to form an epitaxial layer using standard chemical vapor deposition (CVD) techniques. It has been found that transient radiation annealing is particularly advantageous because of the lower power requirements and more localized heating during the annealing process, for example, with a continuous wave laser having a power of about 12–15 watts and a scan speed of about 10 cm/s. Annealing of layer 36 creates an epitaxial region 38 therein, in contact with the exposed surface of substrate 10, bounded by polycrystalline regions 40 over the oxide areas 34. The interfaces 42 between regions 38 and 40 are smoother than the interfaces produced by prior processes. This simplifies subsequent processing steps because the geometry of the device is better defined.

The structure of FIG. 1c, from which various devices may subsequently be fabricated, is scalable since the thickness of the epitaxial layer 36 may be reduced without reducing the thickness of the oxide layer 34. Layer 36 is typically be about 0.5 microns for MOS devices and about 2 microns for bipolar devices, which results in higher packing density. Further, high speed FET devices are possible with the present structure since source-to-substrate capacitance is reduced by the use of a thick oxide layer 34.

Figure 2A:
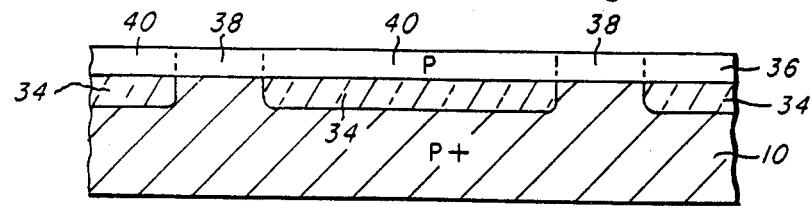
FIGS. 2a–2e are cross-sectional views showing the steps in fabricating an NMOS device according to the present invention.
Figure 2B:
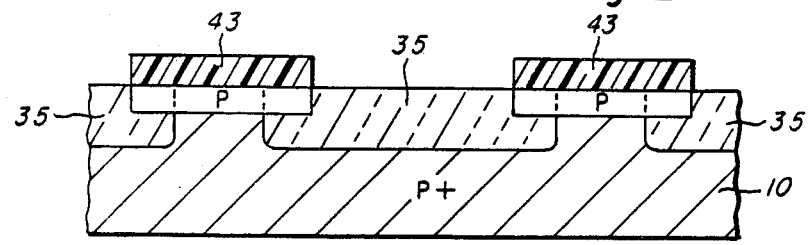
Figure 2C:
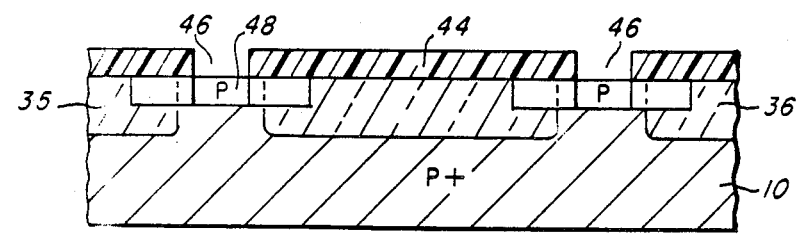
Figure 2D:
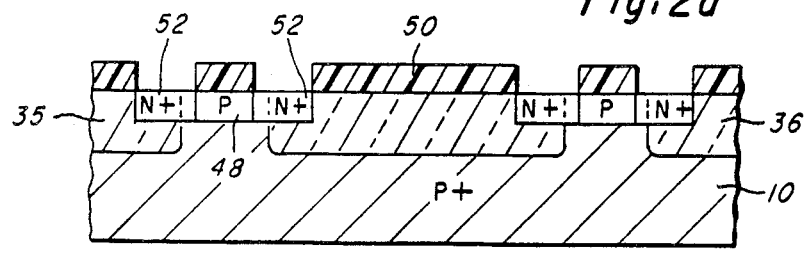
Figure 2E:
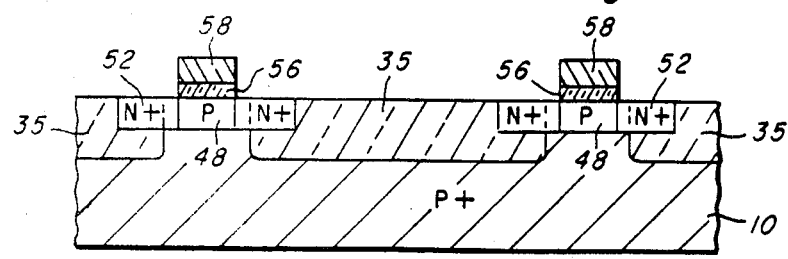

Referring now to FIGS. 2a–2e, the steps for making an NMOS device according to the present process are illustrated. FIG. 2a shows two adjacent NMOS devices at a point in the fabrication process wherein a P-type polysilicon layer 36 has been deposited on a highly doped P+ substrate 10 and subjected to an annealing step as described above. Epitaxial regions 38 are thus formed in the portions of layer 36 in contact with substrate 10 while regions of polycrystalline silicon 40 remain over the oxide areas 34. An insulating layer 43 is deposited on layer 36 and patterned to form masks over the epitaxial regions 38 and the areas immediately adjacent thereto, which will become the source and drain regions in the completed device. The chip is then subjected to a thermal oxidation cycle which converts the exposed areas of polysilicon to oxide, forming the thick oxide layer 35 shown in FIG. 2b. Layer 43 is removed and a resist layer 44 is deposited on layer 36 and openings 46 are formed therein as shown in FIG. 2c using a photolithographic or other suitable technique. The openings 46, which overlap the epitaxial regions 38, form a mask for the doping by diffusion or ion implantation of a region 48 with a desired P-type concentration. Region 48 will subsequently form the active channel region for the device. Layer 44 is removed and an insulating layer 50 is deposited on layer 36 with openings formed therein as shown in FIG. 2d. The device is then subjected to an ion implantation or diffusion step to produce highly doped N+ regions 52 adjacent to each P-type region in layer 36 and extending into the respective epitaxial regions 38.

Layer 50 is removed and the NMOS device is completed by forming gate oxide 56 and gate 58 regions over the respective P-type regions 48. The gate 58 may be formed, for example, of an N+ polysilicon or a metal silicide. The resulant device, in addition to high speed and improved isolation between devices, provides improved immunity to ionizing radiation by reducing minority carrier lifetime in the substrate due to the high doping concentration.

Figure 3:
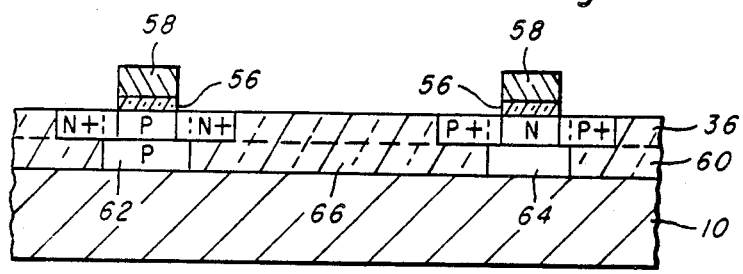
FIG. 3 is a cross-sectional view of a completed CMOS device.

A completed CMOS device fabricated according to the variation of the present process is shown in FIG. 3. A first epitaxial layer 60 is grown by a low pressure CVD process on a P+ substrate 10. Selective masking and doping steps are used to produce spaced apart P-type 62 and N-type 64 regions, which are then masked and the exposed areas of layer 60 are converted to oxide regions 66. An amorphous or polysilicon layer 36 is deposited on layer 60 and annealed, followed by the formation of N+ P N+ and P+ N P+ regions therein as in the NMOS device described above. The device is completed by growth of the gate oxide and by deposition of the gate regions 56 and 58. Layer 60 functions as a buffer layer to prevent a short to the substrate.

Figure 4:
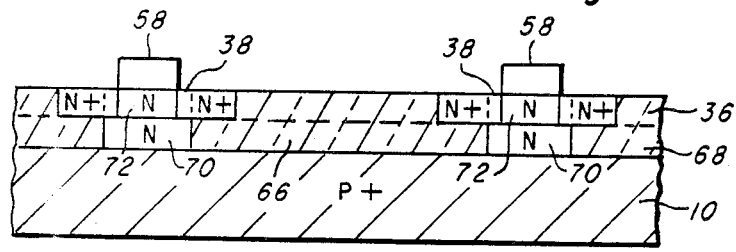
FIG. 4 is a cross-sectional view of a completed MESFET device.

Referring to FIG. 4, there are shown two MESFET devices fabricated by growing an epitaxial buffer layer 68 on a P+ substrate 10 by means of a CVD process. Layer 68 is masked and doped to form spaced apart N-type regions 70 bounded by oxide regions 66. As described above, N+ N N+ regions are formed in layer 36 so that the N-type regions 72 are completly contained within the epitaxial regions 38 in layer 36. A metallic gate 58 formed on N-type region 72 completes the device. In some applications, the buffer layer 68 may not be required.

Figure 5:
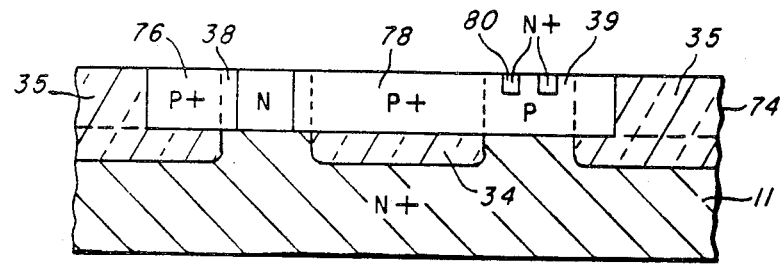
FIG. 5 is a cross-sectional view of a completed I$^2$L device.

In another embodiment of the invention, shown in FIG. 5, an integrated injection logic ($I^2L$) device is fabricated from the basic structure shown in FIG. 1c by depositing an N-type layer 74 on an N+ substrate 11. The horizontal transistor is formed by doping P+ regions 76 and 78 in layer 74 overlying substrate 11 as shown. The adjacent vertical transistor is formed by converting an adjacent epitaxial region 39 to a P-type region followed by the doping of N+ regions 80 therein extending downward from the surface of layer 74. Isolating oxide regions 34 and 35, formed as described above, prevent the injection of holes into the N+ substrate 11 by reducing the area of contact with the P+ regions 76 and 78. Since the speed of the $I^2L$ device is limited by the minority carriers injected into the N+ region, a reduction thereof results in a proportionate increase in speed.

While the present invention has been described and illustrated with respect to specific embodiments, it is to be understood that various modifications may be made without departing from the spirit and the scope thereof. For example, the $I^2L$ device could be formed from an N-type epitaxial layer overlying a P+ substrate, although the resulting P N P vertical transistor would exhibit longer response times because of the inherent lower mobility of holes as compared to electrons.

What is claimed is:

1. A method of fabricating an integrated circuit comprising the steps of:
   depositing a layer of masking material on the surface of a monocrystalline semiconductor substrate;

forming a plurality of openings through said layer of masking material to expose selected surface areas of the monocrystalline semiconductor material of said substrate;

etching said exposed selected surface areas of monocrystalline semiconductor material of said substrate to a predetermined depth to define recesses in the surface of said substrate;

growing insulating material in the recesses in the surface of said substrate to a thickness defining an interrupted insulation layer having a surface substantially coplanar with the surface of said substrate, thereby forming a surface zone having areas of monocrystalline semiconductor material of said substrate bounded by areas of said insulating material;

removing said layer of masking material from the surface of said substrate;

depositing a non-monocrystalline semiconductor layer on said surface zone so as to cover said areas of monocrystalline semiconductor material of said substrate and said areas of said insulating material; and annealing said non-monocrystalline semiconductor layer throughout the thickness thereof to induce epitaxial growth in the regions therein directly above and extending to the surface of said monocrystalline semiconductor material of said substrate.

2. A method as set forth in claim 1, wherein the non-monocrystalline semiconductor layer deposited on said surface zone is polycrystalline semiconductor material.

3. A method as set forth in claim 1, wherein the non-monocrystalline semiconductor layer deposited on said surface zone is amorphous semiconductor material.

4. A method as set forth in claim 1, wherein the annealing of said non-monocrystalline semiconductor layer throughout its thickness is accomplished by thermal annealing.

5. A method as set forth in claim 1, wherein the annealing of said non-monocrystalline semiconductor layer throughout its thickness is accomplished by transient radiation annealing.

6. A method as set forth in claim 1, wherein the monocrystalline semiconductor substrate is of P+-type conductivity, the grown insulating material is oxide, the non-monocrystalline semiconductor layer deposited on said surface zone is of P-type conductivity, and an NMOS integrated circuit device is fabricated, further including the steps of:

selectively masking said epitaxial regions as induced by the annealing of said non-monocrystalline semiconductor layer and the areas immediately adjacent thereto and on opposite sides thereof;

oxidizing the exposed areas of said non-monocrystalline semiconductor layer to combine with the grown oxide material in the recesses in the surface of said substrate in forming a thickened interrupted oxide layer substantially coplanar with the surface of said substrate;

selectively masking and doping said epitaxial regions induced by the annealing of said non-monocrystalline semiconductor layer to form regions of a predetermined P-type conductivity concentration completely contained within said epitaxial regions and extending to the original surface of said substrate;

selectively masking said insulating oxide and said epitaxial regions as derived from said non-monocrystalline semiconductor layer to expose respective regions on opposite sides of said P-type regions;

doping said exposed regions on opposite sides of said P-type regions to form regions of N+ conductivity extending partially into a corresponding one of said epitaxial regions induced by the annealing of said non-monocrystalline semiconductor layer and overlapping the original surface of said substrate;

forming gate oxide regions over said P-type epitaxial regions; and forming conductive gate regions of N+ conductivity over said gate oxide regions.

* * * * *